(12) United States Patent
Xu et al.

(10) Patent No.: US 8,306,781 B2
(45) Date of Patent: Nov. 6, 2012

(54) PROFESSIONAL DIAGNOSIS METHOD OF BATTERY PERFORMANCE ANALYSIS

(75) Inventors: Jianhong Xu, Hangzhou (CN); Ling Yuan, Hangzhou (CN); Yi Zheng, Hangzhou (CN)

(73) Assignee: Hangzhou Gold Electronic Equipment Co., Ltd., Hangzhou, Zhejiang Province (CN)

(*) Notice: Subject to any disclaimer, the term of this patent is extended or adjusted under 35 U.S.C. 154(b) by 223 days.

(21) Appl. No.: 12/596,163

(22) PCT Filed: Apr. 17, 2008

(86) PCT No.: PCT/CN2008/000780
§ 371 (c)(1),
(2), (4) Date: Mar. 23, 2010

(87) PCT Pub. No.: WO2008/128426
PCT Pub. Date: Oct. 30, 2008

(65) Prior Publication Data
US 2011/0054815 A1 Mar. 3, 2011

(30) Foreign Application Priority Data
Apr. 20, 2007 (CN) .......................... 2007 1 0068081

(51) Int. Cl.
*H02J 7/00* (2006.01)

(52) U.S. Cl. ........................................ 702/183; 320/132

(58) Field of Classification Search .................. 702/183, 702/63–35; 320/132, 134; 324/425–434
See application file for complete search history.

(56) References Cited

U.S. PATENT DOCUMENTS

| | | | |
|---|---|---|---|
| 5,977,750 A | 11/1999 | Ng et al. | |
| 6,137,292 A | 10/2000 | Hirsch et al. | |
| 6,259,254 B1 | 7/2001 | Klang | |
| 6,924,622 B1 * | 8/2005 | Anbuky et al. | 320/132 |
| 7,199,557 B2 * | 4/2007 | Anbuky et al. | 320/132 |
| 2005/0017685 A1 * | 1/2005 | Rees et al. | 320/132 |

FOREIGN PATENT DOCUMENTS

| | | |
|---|---|---|
| CN | 1264471 A | 8/2000 |
| CN | 1451972 A | 10/2003 |
| CN | 1890574 A | 1/2007 |
| JP | 2001-296341 A | 10/2001 |
| JP | 2007-120960 A | 5/2007 |

OTHER PUBLICATIONS

Zhang, Yiju, A Neutral Network Approach for Battery Modeling, ACTA Enerfiae Solars Sinica, Oct. 1997, vol. 18, No. 4, pp. 452-456, ISSN: 0254-0096.0.1997-04-019.

* cited by examiner

*Primary Examiner* — Michael Nghiem
*Assistant Examiner* — Manuel Rivera Vargas
(74) *Attorney, Agent, or Firm* — Jacobson Holman PLLC

(57) ABSTRACT

The present invention discloses a professional diagnosis method of battery performance analysis, Through the overall evaluation of experiential data library, several parameters about the battery are input into the artificial neural network, outputting capacity prediction and service life prediction of each battery, etc. and giving useful advices for each battery. Therefore the result is much more in conformity with the real condition of the battery. Besides, it designs an adaptive learning function of the abovementioned artificial neural network. This invention effectively avoids the defect of evaluating the VRLA battery performance at single moment, from single perspective and by single method, and it does the real-time monitoring and evaluating for the performance of the battery during VRLA battery working period, which is easy to operate, and avoids checking discharge test to the battery so that it doesn't affect the cycle life of the VRLA battery.

9 Claims, 5 Drawing Sheets

| Battery No.(1) | Predict Performance | Battery No.(2) | Dynamic IR (DJX) | Battery No.(3) | Voltage difference in the process of dynamic discharge (V1-V3) |
|---|---|---|---|---|---|
| 31 | 53 | 81 | 3.31 | 61 | 0.19 |
| 61 | 55 | 103 | 2.99 | 31 | 0.187 |
| 46 | 56 | 31 | 2.92 | 91 | 0.17 |
| 91 | 56 | 61 | 2.7 | 46 | 0.131 |
| 16 | 58 | 91 | 2.65 | 16 | 0.129 |
| 81 | 58 | 66 | 2.44 | 90 | 0.128 |
| 90 | 59 | 38 | 2.32 | 56 | 0.127 |
| 50 | 60 | 62 | 2.32 | 70 | 0.127 |
| 56 | 60 | 67 | 2.26 | 76 | 0.127 |
| 70 | 60 | 80 | 2.2 | 50 | 0.127 |
| 76 | 60 | 48 | 2.19 | 100 | 0.126 |
| 10 | 62 | 107 | 2.17 | 10 | 0.126 |
| 100 | 62 | 47 | 2.17 | 60 | 0.124 |
| 107 | 65 | 55 | 2.15 | 107 | 0.124 |
| 60 | 66 | 106 | 2.14 | 30 | 0.123 |
| 66 | 67 | 104 | 2.13 | 40 | 0.122 |
| 30 | 68 | 97 | 2.13 | 99 | 0.122 |
| 40 | 69 | 7 | 2.12 | 6 | 0.12 |
| 103 | 69 | 43 | 2.1 | 36 | 0.12 |
| 99 | 70 | 71 | 2.09 | 69 | 0.12 |
| 6 | 73 | 84 | 2.09 | 20 | 0.12 |
| 20 | 73 | 46 | 2.08 | 89 | 0.119 |
| 69 | 74 | 56 | 2.08 | 98 | 0.119 |
| 71 | 78 | 72 | 2.08 | 71 | 0.118 |
| 27 | 79 | 92 | 2.08 | 27 | 0.117 |
| | | 42 | 2.08 | 66 | 0.084 |
| | | 58 | 2.08 | 103 | 0.084 |
| | | 34 | 2.08 | 81 | 0.078 |
| | | 69 | 2.07 | | |
| | | 57 | 2.07 | | |
| | | 23 | 2.07 | | |
| | | 19 | 2.06 | | |
| | | 96 | 2.06 | | |
| | | 93 | 2.06 | | |
| | | 83 | 2.06 | | |
| | | 99 | 2.05 | | |
| | | 89 | 2.05 | | |
| | | 35 | 2.04 | | |
| | | 52 | 2.04 | | |
| | | 21 | 2.04 | | |
| | | 45 | 2.04 | | |
| | | 16 | 2.03 | | |
| | | 76 | 2.03 | | |
| | | 49 | 2.03 | | |
| | | 24 | 2.03 | | |
| | | 3 | 2.03 | | |
| | | 90 | 2.02 | | |
| | | 40 | 2.02 | | |

Figure 8

PROFESSIONAL DIAGNOSIS METHOD OF BATTERY PERFORMANCE ANALYSIS

This is a U.S. national stage application under 35 U.S.C. 371 of PCT/CN2008/000780, filed on Apr. 17, 2008 and published in Chinese, claiming priority from Chinese Application No. 200710068081.9, filed Apr. 20, 2007.

RELEVANT FIELD

This invention relates to the online testing and evaluation technology on performance of valve-regulated lead-acid battery.

BACKGROUND OF THE INVENTION

The valve-regulated lead-acid battery has been widely used in power supply systems of industries like electricity, communications, transportation, finance and army, as back up in substation, machine room, mobile base station, UPS and start up for generators. It is used to provide continuous electricity supply to the electrical load when the commercial power has power supply failure or the commutator breaks down. Therefore the battery plays a very important role in the power supply system.

VRLA is a complicated electrochemical system whose service life and performance are related to many factors including the material of electrodes, techniques, the change of active material and operating situation, etc, and it is also one of the parts of the equipment which is easy to break down. In general, the cause of the performance decrease of VRLA can be briefly classified as follows: dehydration, sulfation, corrosion and deformation of grid, softening of active material and short circuit of dendrite, etc.

The current exiting methods of measuring and evaluating the battery performance:

There are several methods of battery testing, currently used as follows: checking discharge testing, in-process voltage checking, battery internal resistance (conductance) testing and discharge capacity estimating.

1. Checking Discharge Testing

As the standard of battery capacity, checking discharge testing is the most standard and effective performance testing method for the battery, which can completely reflect the battery capacity. It can be used online or offline to measure.

Unfortunately, checking discharge testing has great workload, inconvenient operation and potential danger to the system when doing online testing. This method is not suitable to be used frequently due to the limited battery cycle life. It also does not have the ability of real-time monitoring for the battery working environment.

2. In-Process Voltage Checking

Among the current existing battery testing equipments, the common online monitoring device is in-process checking instrument for a battery set, generally used for online monitoring the voltage, current and temperature of a single battery to judge whether the accumulator is good or bad according to the voltage.

Lots of practical experience shows that, the battery voltage (float charge or equalized charge) during operation almost has no relevance to the battery capacity. In actual practice, we generally use it as the observation and record of battery charge curve or battery float charge data.

3. IR (Conductance) Testing of the Battery

In the 1992 INTELEC Dr. David Feder delivered a thesis on the relevance between conductance and battery capacity which brought up the importance of the conductance measurement to the battery testing. Because of its convenience, its function of finding failure battery and its sensitivity of IR increase due to battery dehydration, the IR or conductance testing method has important reference value of finding out failure battery in time and grasping the change of the battery performance.

However, it is a great pity that the battery capacity doesn't have good relevance to the battery conductance. When the battery capacity is above 80%, the battery capacity almost has no relevance to the battery conductance. Most of battery having linear relation with capacity are failure ones whose capacity is below 80%. Therefore, the value of actual measurement is lost.

4. Discharge Capacity Estimating

It estimates the residual capacity of the battery through 5-15 minutes' load discharge. The theoretical basis of this testing method is comparing to the experiential discharge curves. However, when the battery performance degrades seriously, the discharge curve will change a lot which will lead to the serious deviation of the predict value. Meanwhile, because of the different battery manufacturers, and the batteries themselves are not the same, which will also lead to the deviation of the estimating. Therefore this method is seldom used now.

To sum up, the current battery performance evaluations apply a single method to predict the battery performance at a single time and from a single perspective. Yet it is a very complex process for a battery to change from good to bad and the evaluation of a single model is insufficient. This is the reason why there is no convenient, valid and accurate method to measure the capacity and performance of the battery till now.

SUMMARY OF THE INVENTION

The electrochemical reaction inside the lead-acid battery is very complicated, and there is not only one factor which affects the service life of the VRLA battery. Therefore, it is insufficient to predict the battery performance from single parameter and from a single perspective. To solve abovementioned problems which exist in current techniques, consecutive, varying and related information (such as voltage, current and temperature of the VRLA battery, etc.) is connected to be as the parameters for overall predicting the VRLA battery performance, so as to make the prediction much more accurate.

Generally, there are several working states of the VRLA battery as follows: float charge, equalized charge and discharge. Therefore, the VRLA battery voltage includes float charge voltage, equalized charge voltage and discharge voltage.

FIG. 4 describes the change of VRLA battery float charge voltage before and after replacement, it shows that after the replacement, the fluctuation of VRLA battery float voltage varies from high to low, which is, the dispersion of the VRLA battery float voltage becomes smaller. This shows that the dispersion of the VRLA battery float voltage has relevance to the battery performance; battery with good performance have small dispersion ratio of the float voltage and those with bad performance have large dispersion ratio of the float voltage.

FIG. 5 describes the VRLA battery equalized charge voltage which has relatively bad performance. When many batteries are used in series connection, it is easy to cause unequalized voltage. It will lead to that some worse batteries charge insufficiently if they have been under such condition for a long time. Equalized charge is used to balance the voltage of the whole battery set and do additional charge for worse batteries to help them recover to the fully charged state. From FIG. 5, it can be seen that in equalized charge period the maximum voltage of worse battery is very high and the minimum voltage is very low, and the difference of the two voltages is much bigger than that of batteries with good performance.

FIG. 6 describes the battery IR calculated from battery set dynamic discharge. Battery IR includes ohm IR and polarized IR. Ohm IR consists of electrolyte IR, electrode material IR and barricade IR, etc; polarized IR consists of electrochemical polarization and density polarization. The change of IR is mainly caused by the change of electrolyte density inside the battery and the change of electrode material structure, etc. Therefore, battery IR is an important index of the battery performance. From FIG. 6 it can be seen that battery IR with bad performance is much bigger than that of the battery set average IR.

For a long time, checking discharge testing is an accurate and reliable method for battery capacity measure. However, it costs a long operation period, needs complicated operation and has high risk; frequent deep discharge to the battery will make lead sulfate precipitate, leading to pole plate sulfation and worse capacity. Therefore, it is not suitable to do frequent deep discharge operation to the battery. Through observing curve features of short-term charge and discharge, we can discover the relation among the voltage difference during the short-term charge and discharge process, the end-point voltage of the short-term discharge process and the battery performance: the battery, whose voltage difference during the short-term charge and discharge process is high and the end-point voltage of the short-term discharge process is low, have bad performance; and vise versa.

Temperature is another important factor which affects the service life of the battery. In general, the operating temperature around 25° C. is the best for the battery service life; when it is higher than 25° C., the battery capacity will decrease by half for every temperature increase of 10° C. Due to high temperature will lead to battery thermal runaway which makes the current and temperature of the battery have a cumulative mutual reinforcement that shortens the battery service life. See FIG. 7 shows the specific relation between temperature and battery capacity.

To solve the defects of the current methods of evaluating the battery performance mentioned in "Background Of The Invention", the technological solution of this invention, in consideration of the relation between abovementioned parameters and battery performance, is: professional diagnosis method of battery performance analysis, using any two or more than two online gathered parameters, including maximum voltage of each battery in equalized charge period ($MU_j$), minimum voltage of each battery in equalized charge period ($mU_j$), float voltage dispersion ratio of single battery ($\mu_i$), float voltage dispersion ratio of battery set ($\mu_j$), IR of each battery at the end of the discharge r(i), voltage of each battery at the end of the short-term discharge, voltage difference and temperature of each battery during the short-term charge and discharge, as the input of the artificial neural network which calculates and outputs the performance prediction result of each battery and gives relevant operating advices.

Among which

Float voltage dispersion ratio of single battery ($\mu_i$) can be calculated by equation (3):

$$\mu_i = \frac{1}{n}\sum_{j=1}^{n} U_{ij}, \Delta U_{ij} = \sum_{j=1}^{n} |U_{ij} - \mu_i| \qquad (3)$$

Float voltage dispersion ratio of the battery set ($\mu_j$) can be calculated by equation (4):

$$\mu_j = \frac{1}{num}\sum_{i=1}^{num} U_{ij}, \Delta U'_{ij} = \sum_{i=1}^{num} |U_{ij} - \mu_j| \qquad (4)$$

Where:
$U_{ij}$: The voltage of the battery i at the moment j;
n: Sample period
$\mu_i$: Average float charge voltage of the battery i in sample period n;
$\mu_j$: Average float charge voltage of the battery set at the moment j;
num: The number of battery set;
$\Delta U_{ij}$: Float voltage dispersion ratio of single battery;
$\Delta U'_{ij}$: Float voltage dispersion ratio of battery set.
Discharge battery IR can be calculated by equation (5)

$$r(i) = [U_{ij} - U_{ij+2}]/I \qquad (5)$$

Where, I is the discharge current, and $U_{ij}$ is the voltage of the battery i at the moment j in the discharge period, $U_{ij+2}$ is the voltage of the battery i at the moment j+2 in the discharge process, which satisfy the condition: $(U_{ij} - U_{ij+2}) > 0.002$.

This invention is calculated by two-layer Back-Propagation Neural Network.

Input----->Hidden layer----->Output
(n)------>(12)------->(2)

The number of the battery performance parameters chosen by user determined the number n of the Network input. See FIG. 1 for specific network topological structure.

Through the above analysis, it can be seen that the professional diagnosis method of battery performance analysis uses several parameters which relate to the battery performance as the input of the artificial neural network, outputting capacity prediction and service life prediction of each battery, etc. through the overall evaluation of the experiential data library, and gives operating advices for each battery. Therefore the result matches the real state of the battery much better.

Another feature of this invention is the adaptive learning function of the abovementioned artificial neural network. When the VRLA battery takes the full or half capacity checking discharge testing, the network will automatically change the learning set, restart learning and training, and then form a new evaluation system. This function of dynamically modifying experiential data library makes the system more corresponding with the working environment and the real state of the VRLA battery.

This invention avoids the defect of evaluation the VRLA battery performance at single moment, from single perspective and by single method, and it does the real-time monitoring and evaluating of the battery performance during the VRLA battery working period. This invention is easy to operate, avoids doing checking discharge test to the battery, and doesn't affect the VRLA battery cycle life.

DESCRIPTION OF THE FIGURES

FIG. 8: Operating result of this invention in a substation

DETAILED DESCRIPTION

The network structure of this example introduces is 8 inputs and 2 outputs.

It gathers the real-time working data of the battery such as: voltage, current and temperature, etc. through battery testing system, and uploads the data to background computer at the same time. The data enters the software through the application interface.

Figure 1:
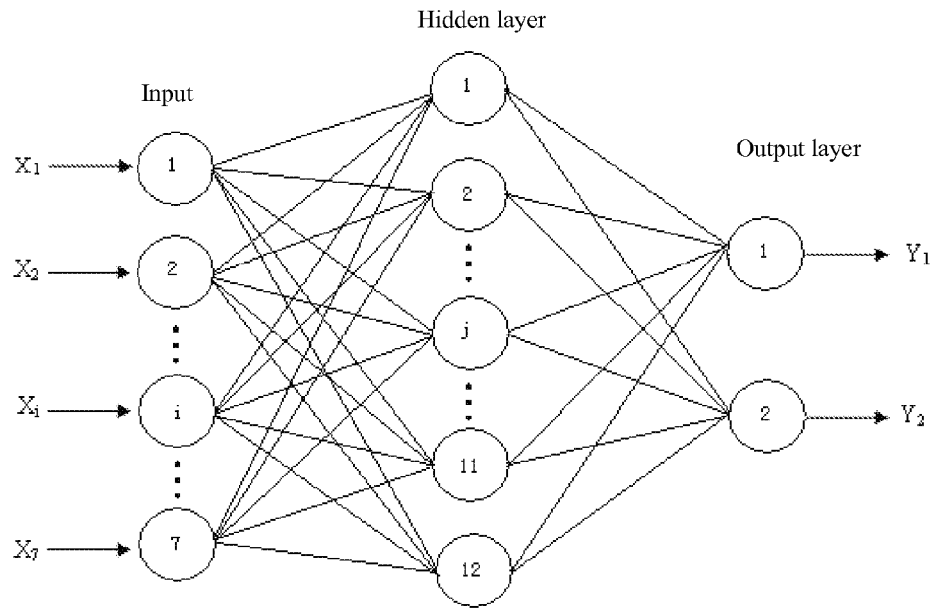
FIG. 1: Specific topological structure of BP Neural Network used in this invention
Figure 2:
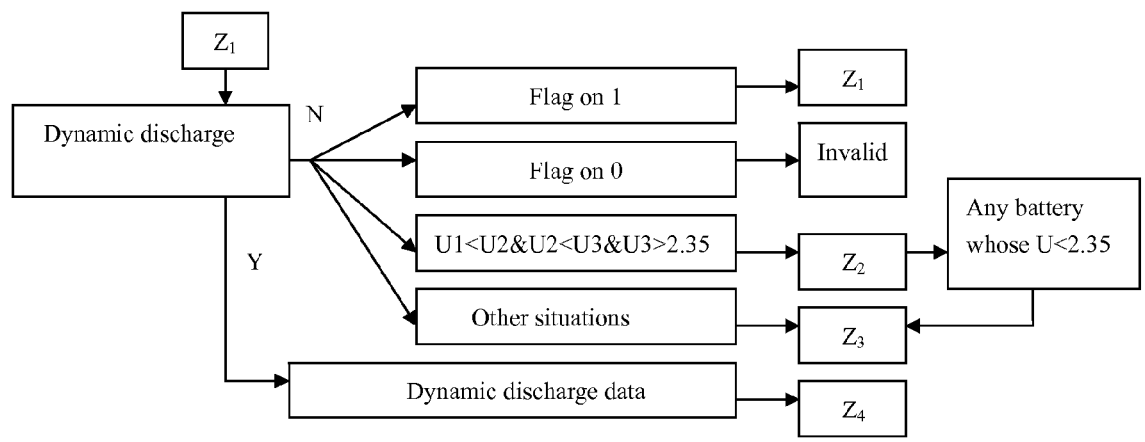
FIG. 2: Identification procedure for the battery state of this invention
Figure 3:
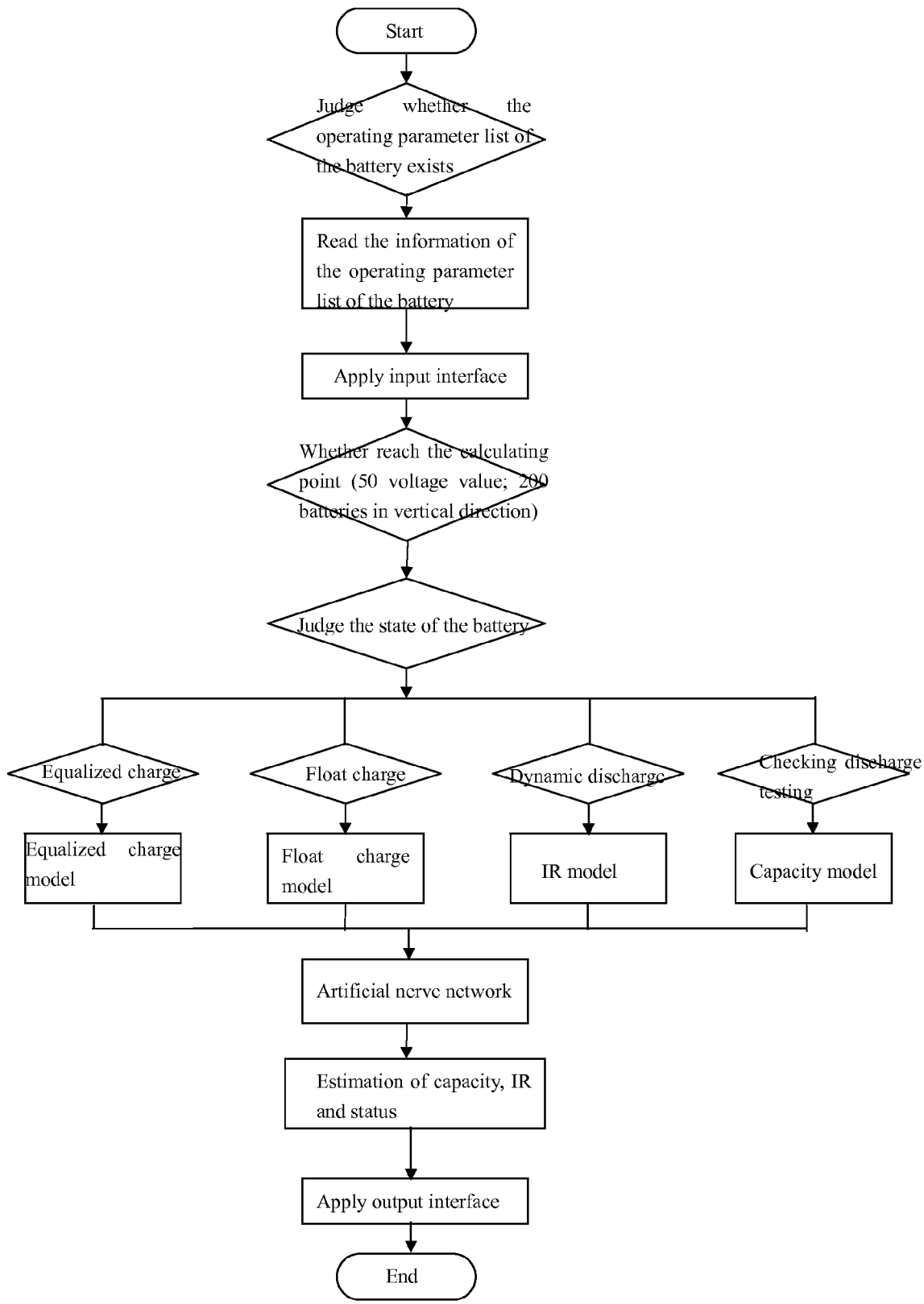
FIG. 3: Whole processing procedure system of this invention
Figure 4:
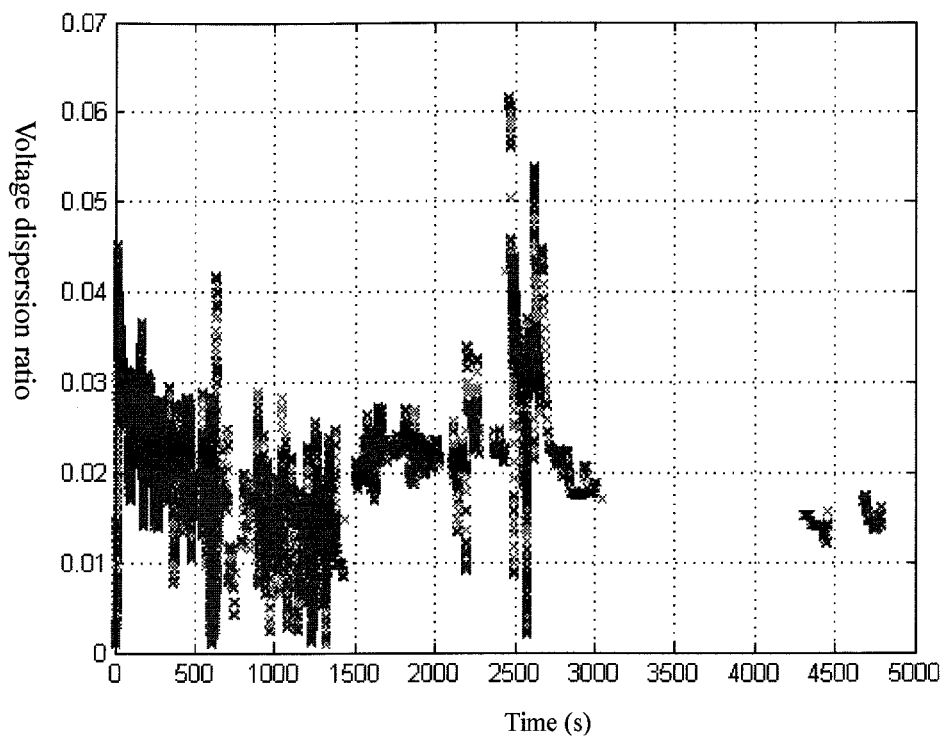
FIG. 4: The change of a single battery float charge voltage before and after replacement
Figure 5:
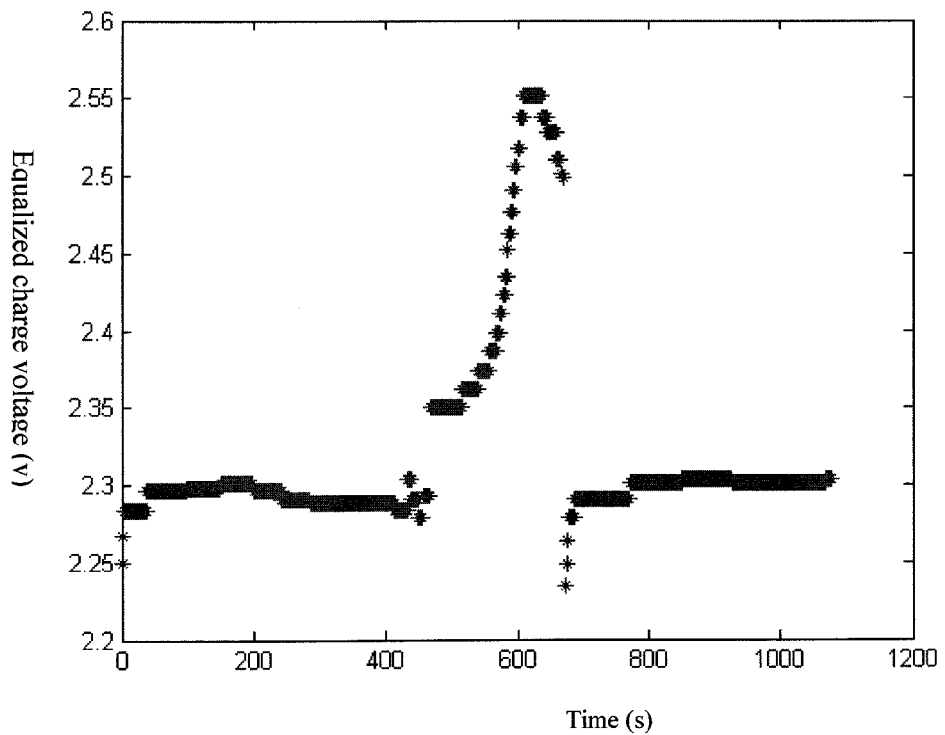
FIG. 5: The equalized charge voltage of a bad performance battery.
Figure 6:
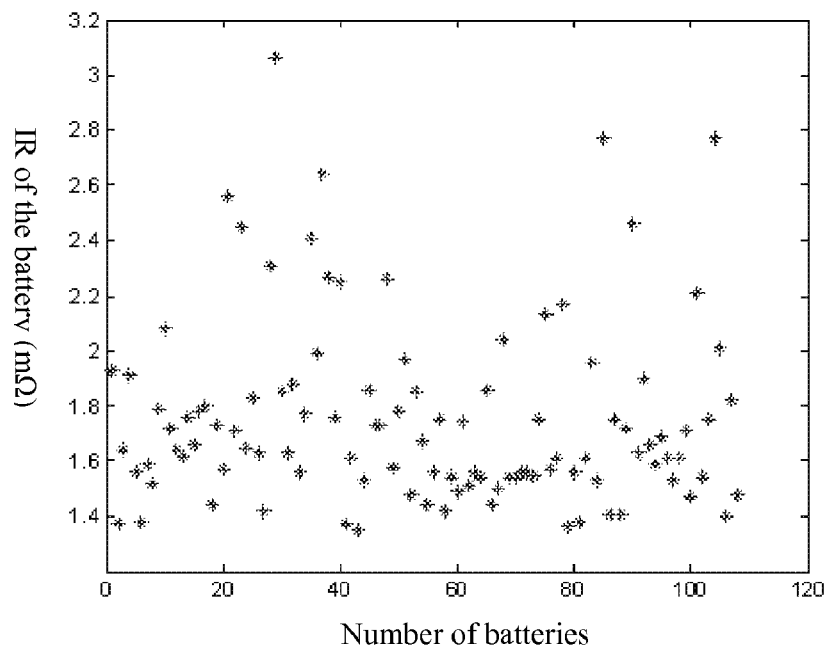
FIG. 6: The IR of a battery set calculated from dynamic discharge
Figure 7:
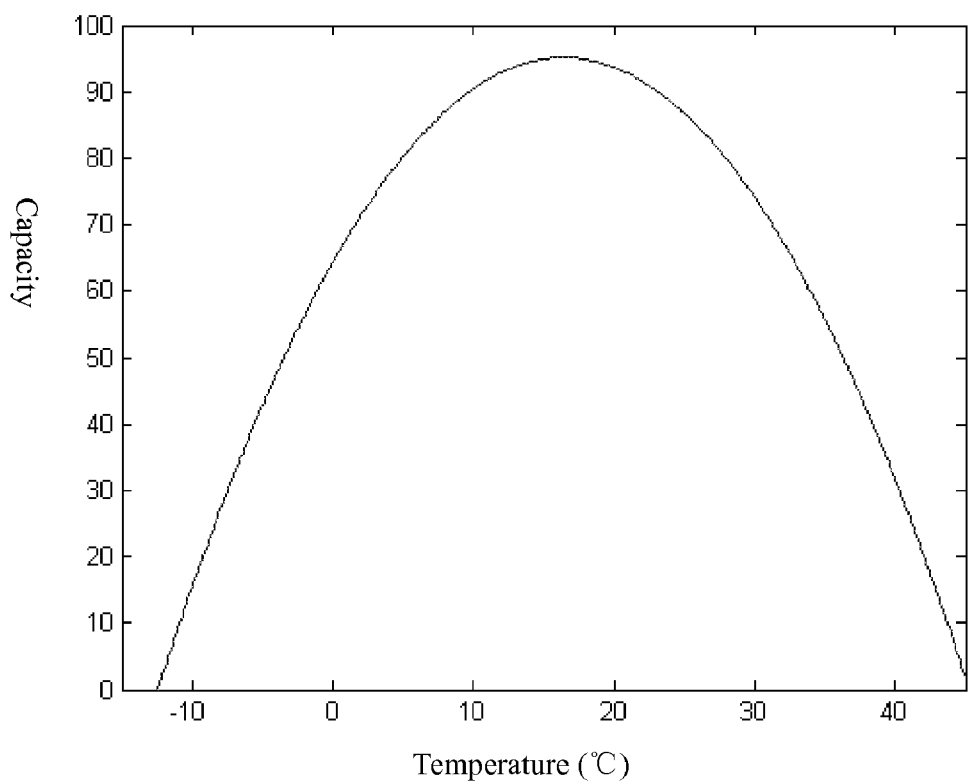
FIG. 7: Relation between the working temperature and capacity of the battery

When the frames of the upload data satisfy the requirement (3 frames of data accumulated), entering the battery working state identification model. FIG. 2 is the battery working state identification procedure of this invention. Where:
$Z_1$: Checking discharge state;
$Z_2$: Equalized charge state;
$Z_3$: Float charge state;
$Z_4$: Discharge state.

When the battery state is $Z_2$ and the end moment of equalized charge is determined, the system processes the equalized voltage through the equation (1) and (2) as follows:
Maximum voltage in equalized charge period ($MU_j$):

$$MU_j = \max(U_{j,0} \ldots U_{jm}) \quad (1)$$

Minimum voltage in equalized charge period ($MU_j$):

$$mU_j = \min(U_{j,0} \ldots U_{jm}) \quad (2)$$

Replace the original default maximum voltage in equalized charge period, minimum voltage in equalized charge period and temperature with the latest ones, and then put them into network, calculate to get the predicted capacity and service life of the battery; give relevant operating advices for each battery according to the result.

When the battery state is $Z_3$, the system processes the float voltage through the equation (3) and (4) as follows at each time 3 frames of data are accumulated.

Float voltage dispersion ratio of single battery can be calculated by equation (3):

$$\mu_i = \frac{1}{n}\sum_{j=1}^{n} U_{ij}, \quad \Delta U_{ij} = \sum_{j=1}^{n} |U_{ij} - \mu_i| \quad (3)$$

Float voltage dispersion ratio of battery set can be calculated by equation (4):

$$\mu_j = \frac{1}{num}\sum_{i=1}^{num} U_{ij}, \quad \Delta U'_{ij} = \sum_{i=1}^{num} |U_{ij} - \mu_j| \quad (4)$$

Where:
$U_{ij}$: The voltage of the battery i at the moment j;
n: Sample period
$\mu_i$: Average float charge voltage of the battery i in sample period n;
$\mu_j$: Average float charge voltage of battery set at the moment j;
num: The number of battery set;
$\Delta U_{ij}$: Float voltage dispersion ratio of single battery;
$\Delta U_{ij}'$: Float voltage dispersion ratio of battery set.

Replace the original default battery float voltage dispersion ration, float voltage dispersion ratio of the battery set and temperature with the latest ones and put them into network, calculating to get the predicted capacity and service life of the battery; give relevant operating advices for each accumulator according to the result.

When the battery state is $Z_4$ and the end moment of the discharge is detected, the system processes the discharge data through the equation (5) as follows and gets the IR of each battery:

$$r(i) = [U_{ij} - U_{ij+2}]/I \quad (5)$$

Where, I is the discharge current, and $U_{ij}$ is the voltage of battery i at the moment j in the discharge process, which satisfy the condition $(U_{ij} - U_{ij+2}) > 0.002$.

Modify the above IR through the equation (6)

$$R(i) = 40.404 \times [r(i) - \bar{r}]^2 + 0.5836371 \quad (6)$$

Where, $\bar{r}$ is the average IR of the battery set.

Replace the original default discharge IR and temperature with the latest ones and put them into network, calculating to get the predicted capacity and service life of the battery; give relevant operating advices for each battery according to the result.

When the battery state is $Z_1$, it is divided into the following two conditions:

(1) If it is short-term discharge process, record the voltage of the end point of this discharge and the voltage difference of this short-term charge and discharge of each battery when the end moment of the checking discharge test is detected.

Replace the original default the voltage of the end point of the short-term discharge of each battery, the voltage difference of this short-term charge and discharge and temperature with the latest ones and put them into network, calculating to get the predicted capacity and service life of the battery; give relevant operating advices for each battery according to the result.

(2) If it is full or half capacity discharge process, the system will automatically replace the learning set and teacher set of the artificial neural network, restart learning and training the network, and then form a set of new rules for evaluation of battery performance which is more corresponding with the real condition of the current battery set.

Specific replacing learning set procedures are as follows:
① Sort the battery by performance according to the checking discharge test result.
② When the battery number is above 12, choose the first, last and middle four of the sorting results at the end voltage of checking discharge test, and replace the corresponding parameters in the original learning set; the storage place of the middle 4 batteries can be calculated by equation (7).

Initial position=num\2−1

Where, num is the battery number of the battery set.
For the battery set whose number<12, choose the voltage at the end of checking discharge test and replace the corresponding parameters in the original set. Mark the specimens which are not replaced, then they could be replaced though next checking discharge test.
③ The specific rule of replacing other parameters in the learning set is as follows:
Read the float voltage dispersion ratio of single battery, float voltage dispersion ratio of the battery set, maximum equalized charge voltage, minimum equalized charge voltage, IR calculated from dynamic discharge, voltage of each battery at the end of the short-term discharge, voltage difference and temperature of each battery during the short-term charge and discharge, which are at the closest moment to the checking discharge test of the chosen battery in procedure ② and then to replace the original value of relevant parameters in the learning set.

④ Replace the teacher set

Read the network-calculated predicted capacity and service life of the chosen batteries in procedure ② after the checking discharge test and replace the original value of relevant parameters in the teacher set.

⑤ After getting new learning set and teacher set, the system restart learning of the network and form a set of new evaluation rules for the battery performance.

FIG. 8 is the operating result of the invention in the case. In the figure the Battery Number (1) is arranged from small to big by the predicted performance according to the output parameters of the model; the Battery Number (2) is arranged from big to small by the IR of the battery, the Battery Number (3) is arranged from big to small by the voltage difference of each battery in the discharge process (here the difference of the voltage at the first point and at the third point is chosen). In the figure the battery numbers marked with red are the ones repeated in the Battery Number.

From the table it can be clearly seen that: among the first 48 of the battery IR, there are 16 batteries coinciding with the predicted worse performance batteries (below 80); and the battery numbers of the ones with predicted bad performance (below 80) can all be found in the first 25 and last 3 battery with the voltage difference calculated from dynamic discharge.

To sum up, this invention applies the knowledge of artificial intelligence to comprehensively evaluate the battery performance through use of any two or more than two parameters, including maximum voltage of each battery in equalized charge period ($MU_j$), minimum voltage of each battery in equalized charge period ($mU_j$), float voltage dispersion ratio of single battery ($\mu_i$), float voltage dispersion ratio of the battery set ($\mu_j$), IR of each battery during discharge r(i), voltage of each battery at the end of the short-term discharge, voltage difference and temperature of each battery during the short-term charge and discharge, as the input of the artificial neural network which calculates and gives the performance evaluation result of each battery and gives relevant operating advices. The consecutive, varying and related information is series connected to be as the parameters for overall evaluation of the performance of the VRLA battery which avoids the defect of evaluating the performance of the VRLA battery at single moment, from single perspective and by single method to make the evaluation much more accurate. Also, it does the real-time monitoring and evaluating for the performance of the battery during VRLA battery working period, which is easy to operate and avoids checking discharge test to the battery and doesn't affect the cycle life of the VRLA battery.

Another feature of this invention is the adaptive learning function of the abovementioned artificial neural network. When the VRLA battery goes through full or half capacity checking discharge testing, the network will automatically change the learning set, restart learning and training and then form a new evaluation system. This function of dynamically modifying experiential data library makes the system more corresponding with the working environment and real condition of VRLA battery.

It shall be understood that: the abovementioned case is only the instruction for the invention not the limitation of it. Any invention and creation not surpassing the actual spirit scope of this invention is under its protection.

The invention claimed is:

1. A professional diagnosis method of battery performance analysis comprising the steps of:
    measuring parameters of a battery set with two or more batteries by a measuring device, the parameters including maximum voltage of each battery in an equalized charge period, minimum voltage of each battery in an equalized charge period, float voltage dispersion ratio of a single battery, float voltage dispersion ratio of the battery set, battery conductance at end of a discharge r(i), voltage of each battery at end of a short-term discharge, voltage difference and temperature of each battery during a short-term charge and discharge;
    then inputting the parameters to an artificial neural network including a computer which calculates and outputs predicted battery performance and gives relevant operating advices;
    wherein said float voltage dispersion ration of a single battery is calculated by equation (3):

$$\mu_i = \frac{1}{n}\sum_{j=1}^{n} U_{ij}, \Delta U_{ij} = \sum_{j=1}^{n} |U_{ij} - \mu_i| \tag{3}$$

the float voltage dispersion ratio of the battery set is calculated by equation (4):

$$\mu_j = \frac{1}{num}\sum_{i=1}^{num} U_{ij}, \Delta U'_{ij} = \sum_{i=1}^{num} |U_{ij} - \mu_j| \tag{4}$$

where:
$U_{ij}$: the voltage of the battery i at the moment j;
n: sample period;
$\mu_i$: average float charge voltage of the batter i in sample period n;
$\mu_j$: average float charge voltage of batter set at the moment j;
num: the number of battery set;
$\Delta U_{ij}$: float voltage dispersion ratio of single battery; and
$\Delta U_{ij}'$: float voltage dispersion ratio of batter set.

2. The professional diagnosis method of battery performance analysis according to claim 1, wherein discharge battery conductance at the end of the discharge is calculated by equation (5):

$$r(i)=[U_{ij}-U_{ij+2}]/I \tag{5}$$

where, I is the discharge current, and $U_{ij}$ is the voltage of the battery i at the moment j in the discharge process, $U_{ij+2}$ is the voltage of the battery i at the moment j+2 in the discharge process, which satisfy the condition: ($U_{ij}-U_{ij+2}$)>0.002.

3. The professional diagnosis method of battery performance analysis according to claim 2, wherein the modifying conductance of each battery is used as the input of the artificial neural network, modifying conductance of each battery is calculated by equation (6):

$$R(i)=40.404\times[r(i)-\bar{r}]^2+0.5836371 \tag{6}$$

where, $\bar{r}$ is the average conductance of the battery set.

4. The professional diagnosis method of battery performance analysis according to claim 1, wherein the artificial neural network has an adaptive learning function, and the network automatically changes a learning set, restarts learning and training, and then forms a new evaluation system under special condition when a valve-regulated lead-acid battery goes through full or half capacity checking discharge testing.

5. The professional diagnosis method of battery performance analysis according to claim 4, wherein specific procedures to change the learning set are as follows:
  (1) sorting the battery by performance according to checking discharge testing result;
  (2) when the battery number is above twelve, choosing the first, last and middle four of sorting results at an end voltage of the checking discharge testing, and replacing corresponding parameters in original learning set; calculating storage place of the middle four batteries by equation (7):

$$\text{initial position} = \text{num}\backslash 2 - 1 \quad (7)$$

wherein, num is the battery number of the battery set;
  when the battery number is below twelve, choosing a voltage at end of the checking discharge testing and replacing corresponding parameters in the battery original set; marking specimens which are not replaced, then replacing them at next checking discharge testing;
  (3) replacing other parameters in the learning set as follows: reading the float voltage dispersion ratio of a single battery, the float voltage dispersion ratio of the battery set, the maximum equalized charge voltage, the minimum equalized charge voltage, the conductance calculated from dynamic discharge, the voltage of each battery at the end of the short-term discharge, the voltage difference and temperature of each battery during the short-term charge and discharge, which are at the closest moment to the checking discharge testing of a chosen battery in procedure and then replacing original values of relevant parameters in the learning set;
  (4) replacing a teacher set by reading the network-calculated predicted capacity and service life of the chosen batteries in step (2) after the checking discharge testing and replacing the original value of relevant parameters in the teacher set; and
  (5) after getting new learning set and teacher set, restarting learning of the network and forming a set of new evaluation rules for the battery performance.

6. A professional diagnosis method of battery performance analysis comprising the steps of:
  measuring parameters of a battery set with two or more batteries by a measurement device, the parameters including maximum voltage of each battery in an equalized charge period, minimum voltage of each battery in an equalized charge period, float voltage dispersion ratio of a single battery, float voltage dispersion ratio of the battery set, battery conductance at end of a discharge r(i), voltage of each battery at end of a short-term discharge, voltage difference and temperature of each battery during a short-term charge and discharge; and
  inputting the parameters to an artificial neural network including a computer which calculates and outputs predicted battery performance and gives relevant operating advices;
  wherein said float voltage dispersion ratio of a single battery is calculated by equation (3):

$$\mu_i = \frac{1}{n}\sum_{j=1}^{n} U_{ij},\ \Delta U_{ij} = \sum_{j=1}^{n} |U_{ij} - \mu_i| \quad (3)$$

the float voltage dispersion ratio of the battery set is calculated by equation (4):

$$\mu_j = \frac{1}{num}\sum_{i=1}^{num} U_{ij},\ \Delta U'_{ij} = \sum_{i=1}^{num} |U_{ij} - \mu_j| \quad (4)$$

where:
  $U_{ij}$: the voltage of the battery i at the moment j;
  n: sample period;
  $\mu_i$: average float charge voltage of the battery i in sample period n;
  $\mu_j$: average float charge voltage of battery set at the moment j;
  num: the number of battery set;
  $\Delta U_{ij}$: float voltage dispersion ratio of single battery; and
  $\Delta U_{ij}'$: float voltage dispersion ratio of battery set; and
wherein discharge battery conductance at the end of the discharge is calculated by equation (5):

$$r(i) = [U_{ij} - U_{ij+2}]/I \quad (5)$$

where, I is the discharge current, and $U_{ij}$ is the voltage of the battery i at the moment j in the discharge process, $U_{ij+2}$ is the voltage of the battery i at the moment j+2 in the discharge process, which satisfy the condition: $(U_{ij} - U_{ij+2}) > 0.002$.

7. The professional diagnosis method of battery performance analysis according to claim 6, wherein the artificial neural network has an adaptive learning function, and the network automatically changes a learning set, restarts learning and training, and then forms a new evaluation system under special condition when a valve-regulated lead-acid battery goes through full or half capacity checking discharge testing.

8. The professional diagnosis method of battery performance analysis according to claim 7, wherein specific changing learning set procedures are as follows:
  (1) sorting the battery by performance according to checking discharge testing result;
  (2) when the battery number is above twelve, choosing the first, last and middle four of sorting results at an end voltage of the checking discharge testing, and replacing corresponding parameters in original learning set; calculating storage place of the middle four batteries by equation (7):

$$\text{initial position} = \text{num}\backslash 2 - 1 \quad (7)$$

wherein, num is the battery number of the battery set;
  when the battery number is below twelve, choosing a voltage at end of the checking discharge testing and replacing corresponding parameters in the battery original set; marking specimens which are not replaced, then replacing them at next checking discharge testing;
  (3) replacing other parameters in the learning set is as follows: reading the float voltage dispersion ratio of a single battery, the float voltage dispersion ratio of the battery set, the maximum equalized charge voltage, the minimum equalized charge voltage, the conductance calculated from dynamic discharge, the voltage of each battery at the end of the short-term discharge, the voltage difference and temperature of each battery during the short-term charge and discharge, which are at the closest moment to the checking discharge testing of a chosen battery in procedure and then replacing original values of relevant parameters in the learning set;

(4) replacing a teacher set by reading the network-calculated predicted capacity and service life of the chosen batteries in step (2) after the checking discharge test and replacing the original value of relevant parameters in the teacher set; and (5) after getting new learning set and teacher set, restarting learning of the network and forming a set of new evaluation rules for the battery performance.

9. The professional diagnosis method of battery performance analysis according to claim 6, wherein uses the modifying conductance of each battery as the input of the artificial neural network, modifying conductance of each battery is calculated by equation (6):

$$R(i)=40.404\times[r(i)-\bar{r}]^2+0.5836371 \qquad (6)$$

where, $\bar{r}$ is the average conductance of the battery set.

* * * * *